(12) United States Patent
Schrader et al.

(10) Patent No.: US 9,596,781 B2
(45) Date of Patent: Mar. 14, 2017

(54) RACK HOUSING TO HOLD A PLURALITY OF INSERTION COMPONENTS

(75) Inventors: Bernhard Schrader, Delbrück (DE); Van Son Nguyen, Warendorf (DE)

(73) Assignee: FUJITSU LIMITED, Kawasaki (JP)

(*) Notice: Subject to any disclaimer, the term of this patent is extended or adjusted under 35 U.S.C. 154(b) by 1165 days.

(21) Appl. No.: 13/696,155

(22) PCT Filed: Mar. 10, 2011

(86) PCT No.: PCT/EP2011/053610
§ 371 (c)(1),
(2), (4) Date: Jan. 7, 2013

(87) PCT Pub. No.: WO2011/138079
PCT Pub. Date: Nov. 10, 2011

(65) Prior Publication Data
US 2013/0127313 A1    May 23, 2013

(30) Foreign Application Priority Data

May 5, 2010 (DE) .................. 10 2010 019 483
May 19, 2010 (DE) .................. 10 2010 021 019

(51) Int. Cl.
*H05K 7/20* (2006.01)

(52) U.S. Cl.
CPC ............. *H05K 7/20* (2013.01); *H05K 7/2019* (2013.01); *H05K 7/20736* (2013.01)

(58) Field of Classification Search
CPC .. G06F 1/20; H05K 7/20172; H05K 7/20572; H05K 7/20736; H05K 7/20181; H05K 7/20

(Continued)

(56) References Cited

U.S. PATENT DOCUMENTS

| | | | |
|---|---|---|---|
| 5,890,959 A | 4/1999 | Pettit et al. | |
| 6,135,875 A * | 10/2000 | French | H02B 1/565 361/695 |

(Continued)

FOREIGN PATENT DOCUMENTS

| | | |
|---|---|---|
| DE | 20 2009 015 124 U1 | 7/2011 |
| EP | 1 727 021 | 11/2006 |

(Continued)

OTHER PUBLICATIONS

English Machine Translation of JP09-116287, Jan. 1993.*

*Primary Examiner* — Gregory Huson
*Assistant Examiner* — Dana Tighe
(74) *Attorney, Agent, or Firm* — Fujitsu Patent Center

(57) ABSTRACT

A rack housing that holds a plurality of insertion components includes a plurality of insertion positions that hold the plurality of insertion components in a first area of the rack housing adjacent to a first housing side, a reduced pressure shaft in a second area of the rack housing adjacent to the first area, wherein between the reduced pressure shaft and the insertion components, first openings are provided to thereby remove air heated by the insertion components into the reduced pressure shaft, at least two second openings that suction off heated air from the reduced pressure shaft, and at least two non-return arrangements located in the reduced pressure shaft and correlated to the two second openings, the non-return arrangements preventing entry of air through the correlated second opening if no air is suctioned off through this second opening.

15 Claims, 6 Drawing Sheets

(58) Field of Classification Search
USPC ............................. 454/184; 417/32; 312/236
See application file for complete search history.

(56) References Cited

U.S. PATENT DOCUMENTS

| | | | | |
|---|---|---|---|---|
| 6,991,533 | B2* | 1/2006 | Tsai | H05K 7/2019 |
| | | | | 361/695 |
| 7,508,663 | B2* | 3/2009 | Coglitore | H05K 7/20736 |
| | | | | 165/122 |
| 9,395,771 | B1* | 7/2016 | Germagian | G06F 1/20 |
| 2002/0173266 | A1* | 11/2002 | Sharp | H05K 7/20754 |
| | | | | 454/184 |
| 2003/0010477 | A1* | 1/2003 | Khrustalev | H05K 7/20681 |
| | | | | 165/104.33 |
| 2004/0130872 | A1* | 7/2004 | Cravens | H05K 7/20727 |
| | | | | 361/695 |
| 2005/0168945 | A1 | 8/2005 | Coglitore | |
| 2007/0081888 | A1* | 4/2007 | Harrison | F04D 19/007 |
| | | | | 415/47 |
| 2008/0310103 | A1 | 12/2008 | Della Fiora et al. | |
| 2011/0036554 | A1 | 2/2011 | Scheidler et al. | |

FOREIGN PATENT DOCUMENTS

| | | |
|---|---|---|
| JP | 59-2197 | 1/1984 |
| JP | 60-147903 | 8/1985 |
| JP | 5-21978 | 1/1993 |
| JP | 9-116287 | 5/1997 |
| JP | 9-266324 | 10/1997 |
| JP | 2009-105256 | 5/2009 |

\* cited by examiner

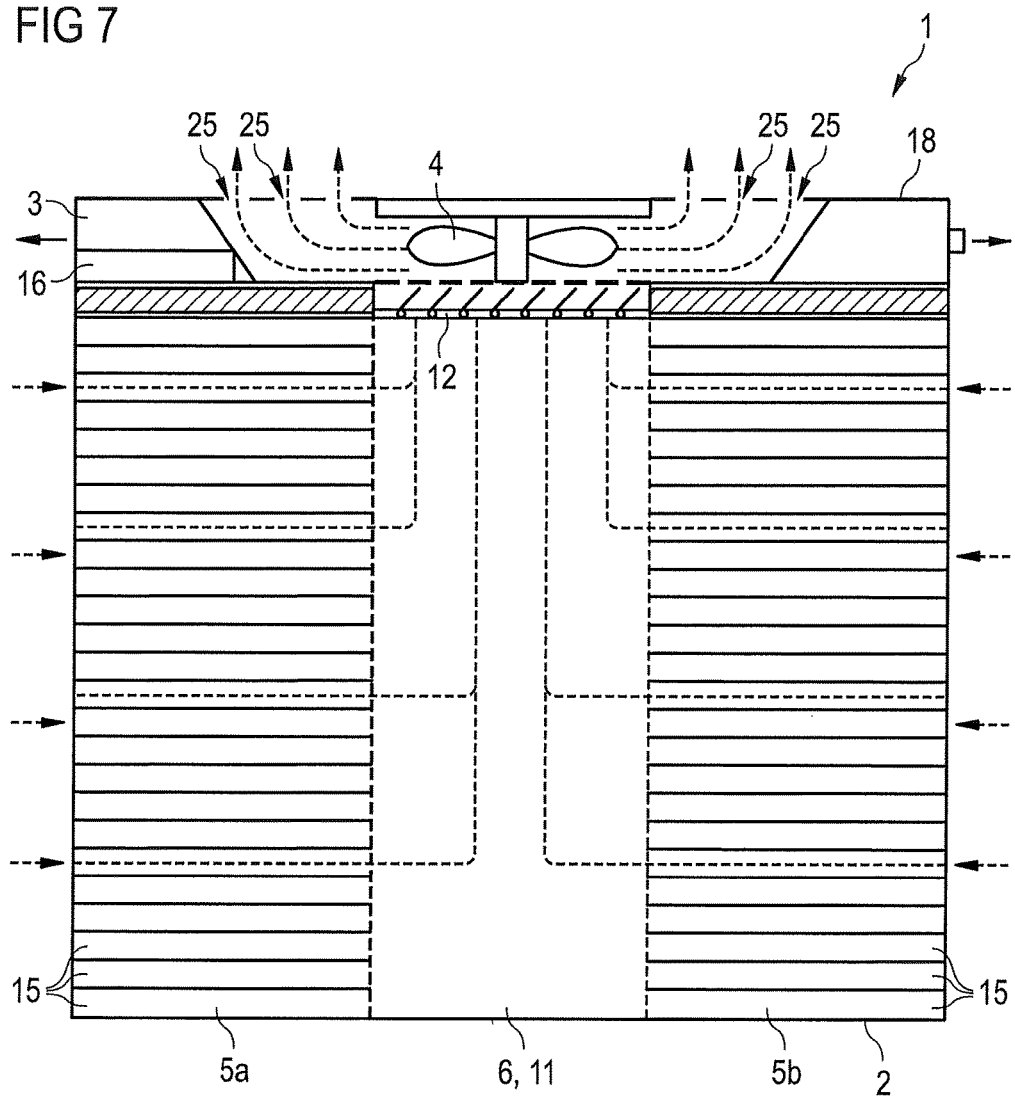

RACK HOUSING TO HOLD A PLURALITY OF INSERTION COMPONENTS

RELATED APPLICATIONS

This is a §371 of International Application No. PCT/EP2011/053610, with an international filing date of Mar. 10, 2011 (WO 2011/138079 A1, published Nov. 10, 2011), which is based on German Patent Application Nos. 10 2010 019 483.2, filed May 5, 2010, and 10 2010 021 019.6, filed May 19, 2010, the subject matter of which is incorporated herein by reference.

TECHNICAL FIELD

This disclosure relates to a rack housing to hold a plurality of insertion components. In particular, it relates to a rack housing with a plurality of insertion positions to hold the plurality of insertion components in a first area of the rack housing, which is adjacent to a first housing side.

BACKGROUND

Rack housings are known. For example, they are used in the telecommunications industry to hold switching devices. In the computer industry, such rack housings, in particular, in the form of 19" rack housings, are used to hold server computers. In particular, in so-called "server farms" in which a large number of server computers is to be arranged in as small a space as possible, those rack housings are advantageous since they permit compact placement of the insertion components.

One problem with the relatively dense placement of insertion components in a common rack housing is to be found in their cooling. During their operation, electrical and electronic insertion components often produce a not inconsiderable amount of waste heat which must be regularly removed to ensure correct functioning of the insertion components.

For this purpose, the provision in the individual insertion components of ventilators and similar cooling devices, which cool individual heat-generating parts of the insertion components by air or a similar cooling medium, is known. Especially in computer centers, it is common to jointly remove heated air generated by several components. To keep the ambient conditions in such computer centers at a level that is bearable for the persons employed there and also for the insertion components, air conditioning systems are often installed to cool the ambient air in the spaces in which a large number of insertion components are located.

One problem of known rack housings is in the controlled and highly efficient removal from the common rack housing of the waste heat often generated by several insertion components at many different sites of individual insertion components. In addition to the efficiency of the arrangement, this should also ensure operational reliability of the individual insertion components taken up in the rack housing.

SUMMARY

We provide a rack housing that holds a plurality of insertion components including a plurality of insertion positions that hold the plurality of insertion components in a first area of the rack housing adjacent to a first housing side, a reduced pressure shaft in a second area of the rack housing adjacent to the first area, wherein between the reduced pressure shaft and the insertion components, first openings are provided to thereby remove air heated by the insertion components into the reduced pressure shaft, at least two second openings that suction off heated air from the reduced pressure shaft, and at least two non-return arrangements located in the reduced pressure shaft and correlated to the two second openings, the non-return arrangements preventing entry of air through the correlated second opening if no air is suctioned off through this second opening.

BRIEF DESCRIPTION OF THE DRAWINGS

FIG. 7 is a cross-section through a rack housing in accordance with a third example.

REFERENCE SYMBOL LIST

Figure 1:
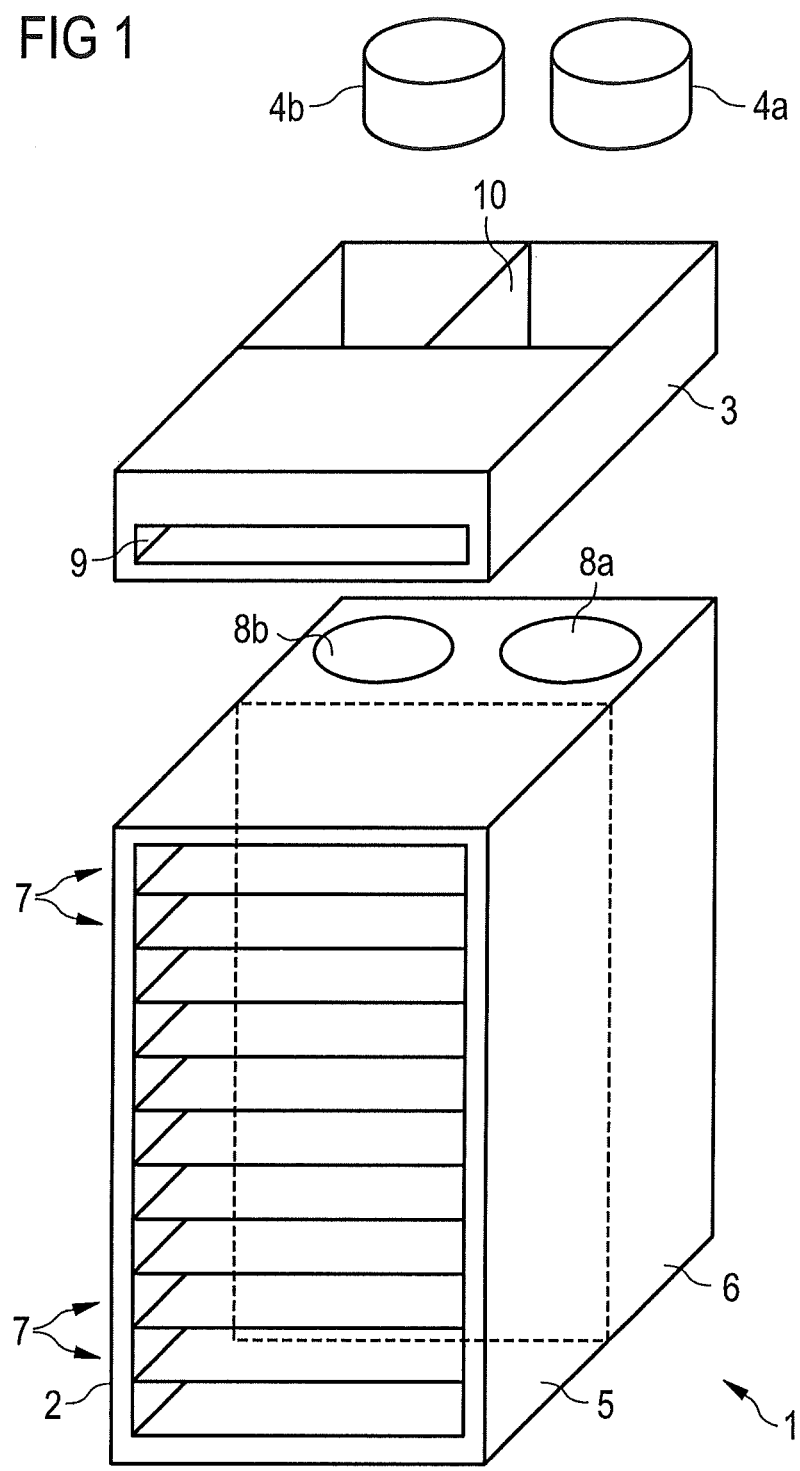
FIG. 1 is a schematic representation of a rack housing with corresponding exhaust air unit in accordance with a first example.

1 Housing
2 Housing cabinet
3 Exhaust air unit
4 Ventilator unit
5 First area
6 Second area
7 Insertion position
8 (Second) opening
9 Insertion shaft
10 Separation wall
11 Reduced pressure shaft
12 Return arrangement
13 (Upper) area
14 (Lower) area
15 Insertion component
16 Control device
17 Pressure sensor
18 Holding device
19 Exhaust air hood
20 Partition wall
21 Section
22 (First) opening
23 Separation wall
24 Insert
25 Ventilation opening
26 Heat exchanger

DETAILED DESCRIPTION

We provide a rack housing to hold a plurality of insertion components which comprises a plurality of insertion positions to hold the plurality of insertion components in a first area of the rack housing adjacent to a first housing side and a reduced pressure shaft in a second area of the rack housing adjacent to the first area, wherein between the reduced pressure shaft and the insertion components, first openings are provided, which make possible removal of air heated by the insertion components into the reduced pressure shaft.

The rack housing comprises at least two second openings to suction off the heated air from the reduced pressure shaft and at least two non-return arrangements located in the reduced pressure shaft and correlated with the two second openings, which prevent penetration of air through the correlated second opening, if no air is suctioned off through the second opening.

Such a rack housing with a central reduced pressure shaft to transport away air heated by the plurality of insertion components makes possible a central cooling air management for the rack housing. The provision of two second openings correlated with a return arrangement ensures the functioning of the reduced pressure shaft even if an individual apparatus for suctioning off warm air fails, At least one separation wall that may be located at least partially in the reduced pressure shaft located between the at least two non-return arrangements; and the separation wall separates the second openings from one another for ventilation purposes. Such a separation wall can increase the flow resistance between the two second openings so that there will not be a short-circuit flow between the two second openings in the case of a breakdown of a suction device for the heated air.

The rack housing may have a partition wall located between the first and second areas, wherein the first openings are located in the partition wall. By providing such a partition wall with openings, the air resistance between the first area with the plurality of insertion components and the second area with the reduced pressure shaft can be adjusted in accordance with the requirements.

Preferably, the rack housing has a density, size, and/or number of first openings of the partition wall that depend on the distance of the insertion position to the second openings and/or the non-return arrangements. With the use of such a partition wall, it is possible to largely omit the provisioning of adjustment elements for the adjustment of a flow resistance.

An exhaust air unit with at least two ventilator units correlated with the second openings may be located on the rack housing to suction off the heated air. Such an exhaust air unit can produce a reduced pressure in the reduced pressure shaft.

The exhaust air unit may comprise a heat exchanger for the transfer of thermal energy of the heated air to a cooling medium. If the thermal energy of the heated air is transferred to another cooling medium, the use of air conditioning systems in the area of the rack housing can largely be omitted.

The ventilator units may be designed as axial ventilators or screw ventilators and the exhaust air unit may be open upwardly in the area of the ventilator units. With such an exhaust air unit, air resistance is reduced when heated air is pumped out of the reduced pressure shaft so that a particularly efficient operation of the exhaust air unit is possible.

The at least two ventilator units may be located in at least two separate holding devices which can be removed individually from the exhaust air unit. Such an arrangement permits the simple changing of the individual ventilator units during the operation of the exhaust air unit.

The ventilator units may be designed as hot-plug components that can be removed during operation, wherein during removal of one of the ventilator units, the correlated second opening of the rack housing is automatically closed by the correlated return arrangement so that suctioning off of the heated air via the other ventilator unit takes place. Such a rack housing facilitates the replacement of ventilator units and, at the same time, permits continued operation of the rack with the insertion components located therein during replacement of a ventilator unit.

The non-return arrangements may be automatically closed if a lower air pressure prevails in the reduced pressure shaft than in the area of the corresponding second opening and, open automatically, if a higher air pressure prevails in the reduced pressure shaft than in the area of the corresponding second opening. It is thus largely possible to omit a separate control of the non-return arrangements. In the aforementioned case, this is brought about by the pressure difference between the reduced pressure shaft and the area of the corresponding second openings.

Other advantages are explained below and in the following description of selected examples in conjunction with the Drawings.

FIG. 1 shows an exploded view of a rack housing 1. The rack housing 1 comprises a housing cabinet 2, an exhaust air unit 3, and two ventilator units 4a and 4b.

The housing cabinet 2 is classified into a first area 5 and a second area 6. The first area 5 is in a front part of the housing cabinet 2. The second area 6 is in a following back part of the housing cabinet 2. The first area 5 has in total eleven insertion positions 7. Into the insertion positions 7, insertion components, not depicted in FIG. 1, can be inserted from the front in the housing cabinet 2.

In accordance with FIG. 1, a separation plate is provided between the individual insertion positions 7. Instead of a separation plate, the insertion positions 7, however, can also be separated from one another merely by housing walls of the held insertion components. In this case, it is also possible to accommodate insertion components with different heights into the housing cabinet 2. For example, it is possible to accommodate insertion components that extend over several insertion positions 7 lying above one another.

The housing cabinet 2 is largely closed off in an airtight manner on the sides, toward the back and downwardly. Two openings 8 are provided on an upper housing area. They are used to conduct away heated air from the interior of the housing cabinet 2. In particular, suctioning off warm air through the openings 8a and 8b in the second area 6 of the housing cabinet 2 produces a reduced pressure. If there is such a reduced pressure in the second area 6, then warm air generated by insertion components held in the insertion positions 7 is suctioned off into the second area 6 of the housing cabinet 2. This does not require that ventilation units be provided in the individual insertion components. Such ventilation units can be optionally used in the individual case to increase the throughflow in individual areas of the insertion components. However, such additional ventilators can lead to turbulence and disturb the ventilation of other insertion components so that their use should be preferably omitted.

The reduced pressure in the second area 6 of the housing cabinet 2 is produced or maintained by the two ventilator units 4a and 4b located in the exhaust air unit 3. To this end, a control unit not shown in FIG. 1 is used, which can be held, for example, in an insertion shaft 9 of the exhaust air unit 3.

The ventilator units 4a and 4b are, for example, so-called "screw" ventilators, in which the warm air suctioned off from the housing cabinet 2 is in part released upwardly and in part to the sides. To hinder the heated air as little as possible, the exhaust air unit 3 is upwardly open in a back area, which approximately corresponds to the projection of the second area 6 of the housing cabinet 2 into the horizontal plane. The warm air suctioned off by the ventilator units 4a and 4b can therefore be removed to a large extent upwardly without hindrance. Only between the first ventilator unit 4a and the second ventilator unit 4b is a separation wall 10 provided in this example to prevent the appearance of short-circuit flows when one of the ventilator units 4a or 4b breaks down.

Figure 2:
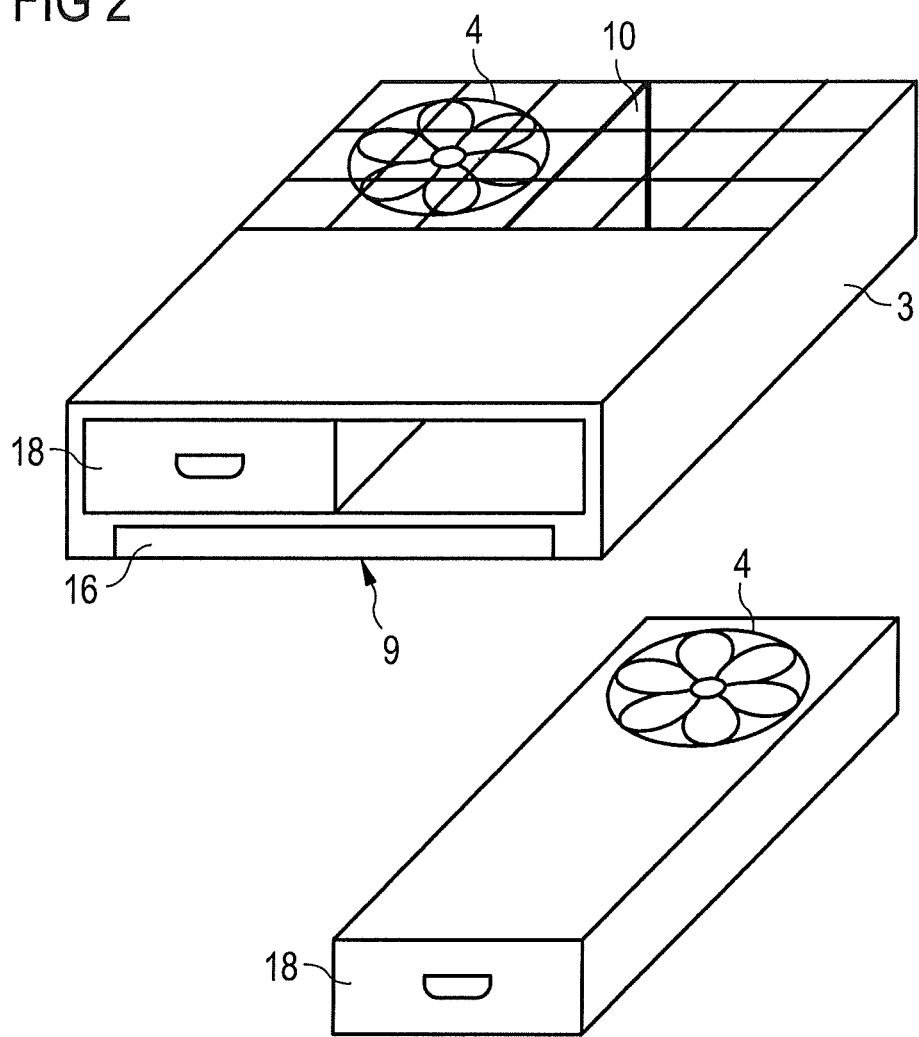
FIG. 2 is a schematic representation of a rack housing in accordance with a second example.

FIG. 2 shows a perspective view of an exhaust air unit 3 in accordance with a second example.

An insertion shaft 9 for a control device 16 is located at the very bottom in the housing of the exhaust air unit 3. Above this, there are two holding devices separated from one another to hold a ventilator unit 4. The ventilator unit 3 is open upwardly and has a protective grid 27 in the area of the ventilator units. Alternatively, the protective grid 27 can also be placed directly on the ventilator units 4 or the holding device 18 or be left off completely.

The holding devices are designed like drawers so that the ventilator units 4 located therein can be simply taken out in a forward direction from the exhaust air unit 3. The electrical connection of the ventilator units 4 is designed such that taking out and replacing the ventilator units can also be undertaken while the exhaust air unit 3 is in operation. For example, the control device detects the breakdown or removal of a ventilator unit and regulates the remaining ventilator at a higher speed. After insertion or connection of a new ventilator unit, the speed of the two ventilators, for example, is once again reduced to a lower speed.

Figure 3:
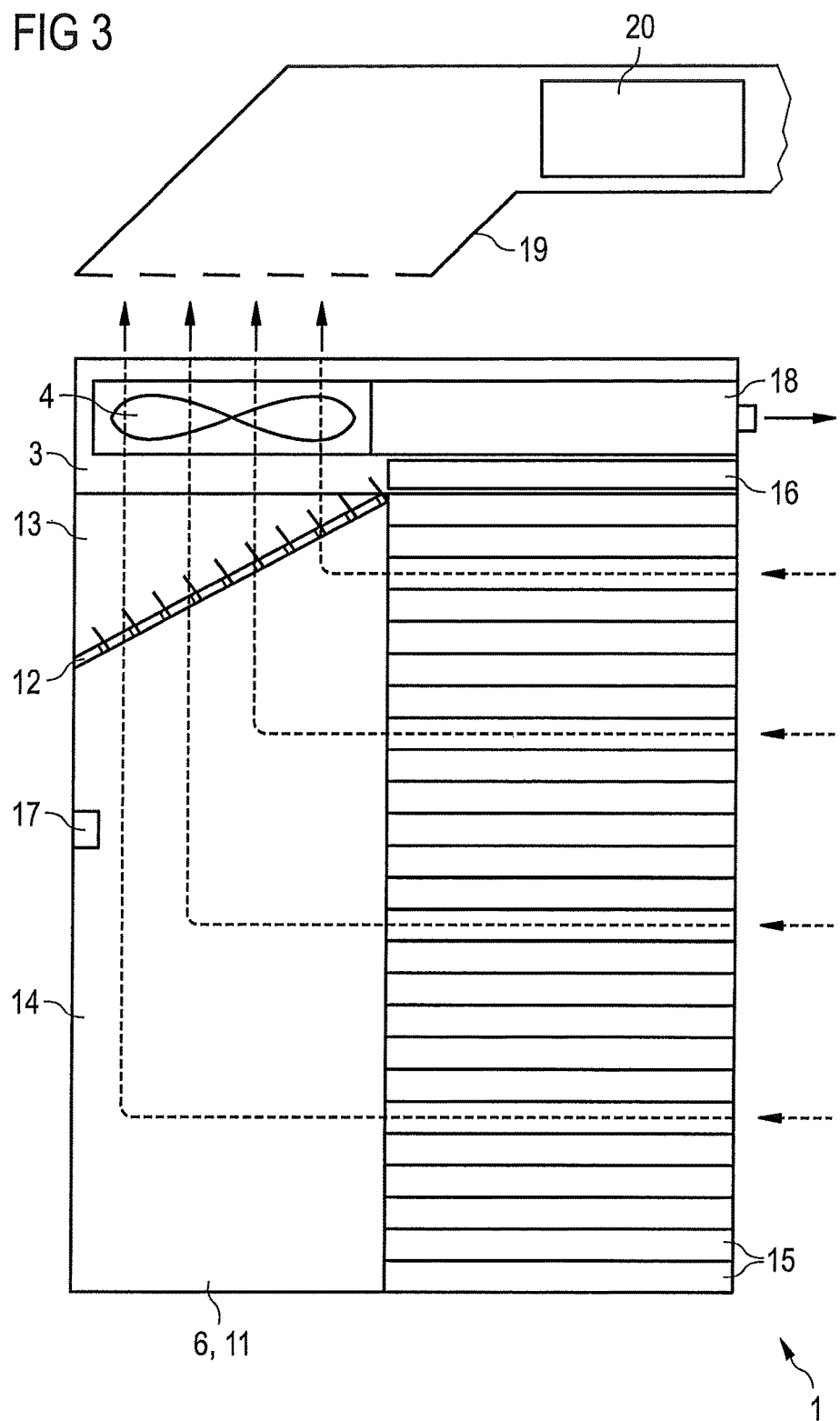
FIG. 3 is a cross-section through the rack housing in accordance with the second example.

FIG. 3 shows a cross-section through the rack housing 1 in accordance with the second example. One can see in the cross-section of FIG. 3 that non-return arrangements 12 are located in the second area 6, which at the same time forms a reduced pressure shaft 11. In this example, the non-return arrangements 12 constitute a lamellae grid.

As shown in FIG. 3, the lamellae grid is located at an incline—that is, it is not located in the horizontal plane. This has, among other things, the advantage that the opening angle of the individual lamellae can be smaller than in a horizontal arrangement. In this way, the force needed to open the lamellae can be reduced without the result being a reduction of the penetration surface. A further reduction of the force needed can be effected through a shift of the rotating axis of the lamellae, in particular, placement of the rotating axis in the vicinity of the center of gravity of the lamellae.

Without the effect of external forces, the lamellae of the lamellae grid shown in FIG. 3 fall back into a closed position. However, if, in an area 13 between the return arrangement 12 and a ventilator unit 4, a smaller air pressure prevails than in an area 14 below the return arrangement 12—for example, because air is suctioned off upwardly through the ventilator unit 4—the lamellae of the return arrangement 12 are opened. In this way, warm air generated by the insertion components 15 can be conducted way upwardly via the ventilator unit 4 of the exhaust air unit 3.

Both the ventilator unit 4 as well as the return arrangement 12 are present at least twice in the rack housing 1 described to ensure redundancy in the case of a breakdown of one of the ventilator units 4. This cannot be seen in the cross-section of FIG. 3, however, since the ventilator units 4 and the non-return arrangements 12 relative to the depicted sectional plane are arranged one behind the other. If one of the ventilator units 4, for example, a ventilator unit 4a, breaks down, the air pressure in the upper area 13 rises between the ventilator unit 4a and the return arrangement 12, and the lamellae close. In this case, warm air generated by the insertion components 15 can continue to be suctioned off by the other return arrangement 12 with another ventilator unit 4b so that a reduced air pressure prevails in the reduced pressure shaft 11 just as before relative to the ambient air pressure.

Preferably, the rack housing 1 comprises to this end a control device 16, which monitors the functioning and/or the speed of the ventilator units 4. In addition or alternatively, one or more pressure sensors 17 can also be provided in the area of the reduced pressure shaft 11 to determine the absolute pressure in the reduced pressure shaft 11 or a relative reduced pressure with respect to a reference sensor on the outside of the rack housing 1 and to control the ventilator units 4 accordingly. If the control device 16, for example, detects a rise in the air pressure in the reduced pressure shaft 11 because a first ventilator unit 4a has broken down, it can control a second ventilator unit 4b such that by increasing its speed, it reduces the air pressure once more to a prespecified desired value in the area of the reduced pressure shaft 11.

Alternatively, it is also possible to omit the sensor 17 and instead to send back a tacho signal, as is provided by many ventilators, to the control device. In this case, monitoring the ventilator units 4 can take place additionally or exclusively with the aid of the tacho signal.

To make possible maintenance or a repair of the ventilator units 4 during the ongoing operation of the rack housing 1, the ventilator units 4 as described with reference to FIG. 2 are arranged in drawer-like holding devices 18, which can be pulled forwardly from the rack housing 1 as indicated by the arrow in FIG. 3.

In the example depicted in FIG. 3, the ventilator unit 4 is a so-called "axial" ventilator that upwardly suctions off warm air generated by the insertion components 15 in a straight direction from the reduced pressure shaft 11. To capture the generated warm air, an exhaust air hood 19 is provided in the arrangement in accordance with FIG. 3. It takes up as completely as possible the exhaust air expelled by the exhaust air unit 3. To recover at least a part of the thermal energy contained in the warm air, a heat exchanger 26 is placed in an exhaust air connector of the exhaust air hood 19. The heat exchanger receives a throughflow of a cooling medium, for example, water. In this way, waste heat generated by the insertion components 15 of the rack housing 1 can be centrally conducted away in a simple and efficient manner. Of course, it is also possible to integrate the heat exchanger into the exhaust air unit 3. In connection with intelligent heating concepts, it is possible to use the waste heat conducted away at another site of a surrounding building, for example, to heat offices.

Instead of using the exhaust air unit 3, the rack housing 1 can of course also be connected directly to a central building air conditioning system. For example, the warm air from the openings 8 can be connected via hoses to one or more exhaust air channels of a building installation.

Figure 4:
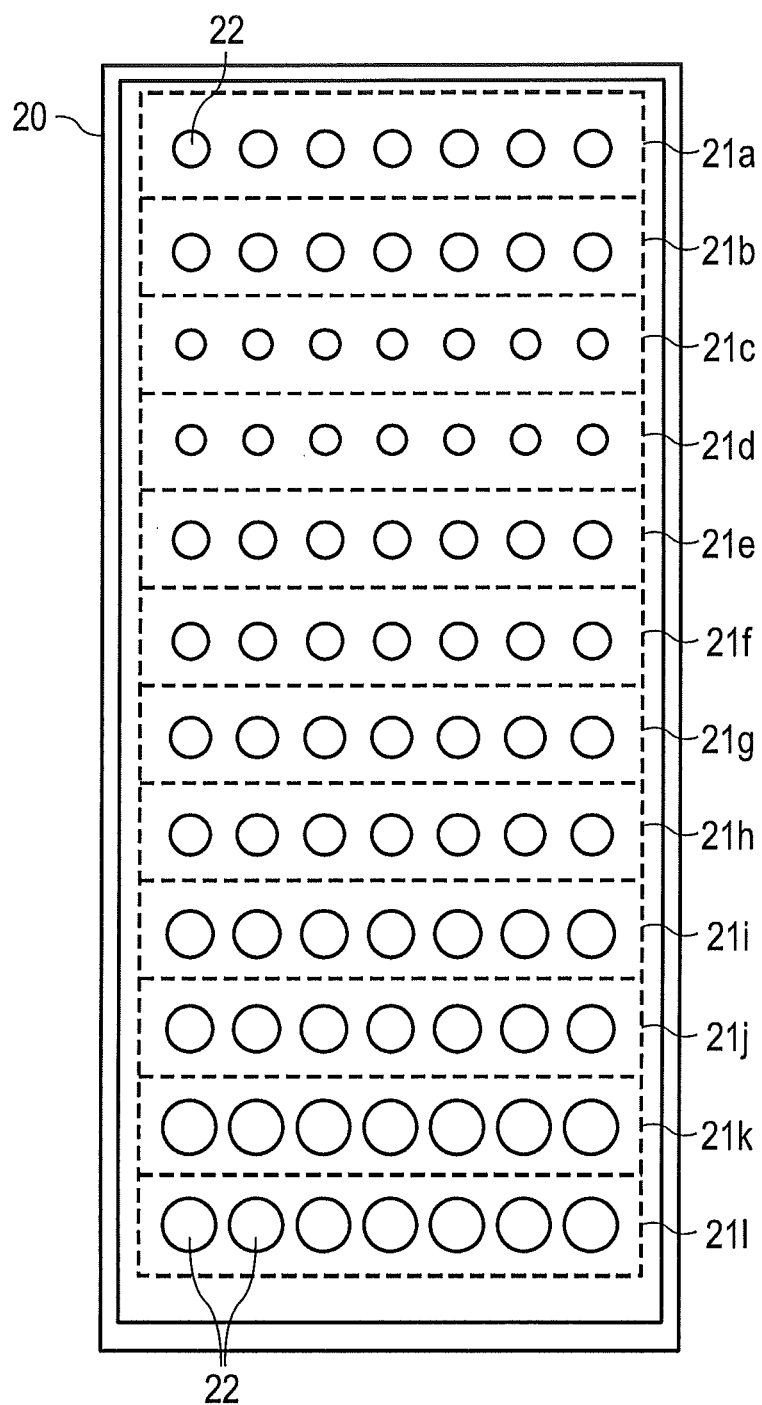
FIG. 4 is a top view of a partition wall in accordance with the second example.

FIG. 4 shows a partition wall 20, which in one example separates the first area 5 and the second area 6 of the housing cabinet 2 from one another. The partition wall 20 has a number of sections 21a to 21j correlated with the insertion positions 7 of the rack housing 1. In each section 21, several first openings 22 are located in the example. The diameter of the first openings 22 varies thereby as a function of the position of the sections 21.

In particular, the diameter of the openings 22 generally increases from top to bottom. This ensures that the air penetration surface in the lower area of the rack housing 1 is larger than in the upper area, which lies closer to the exhaust air unit 3. Deviating from this general trend, larger openings 22 are again provided in the example in the sections 21a and 21b situated at the very top to compensate for the partial cover of the upper insertion positions 7 by the return arrangement 12 or turbulence caused by the return arrangement 12 and thus the resultant increase of the air resistance.

Instead of the size of the openings 22, of course, it is also possible to change their number or density as a function of the insertion position 7 to adjust the air resistance. Also, an active regulation with adjustable openings is possible. Alternatively, the openings 22 are provided in a back side of the insertion positions 7 or in a back wall of the insertion components 15 themselves. The additional partition wall 20 can then be omitted.

Figure 5:
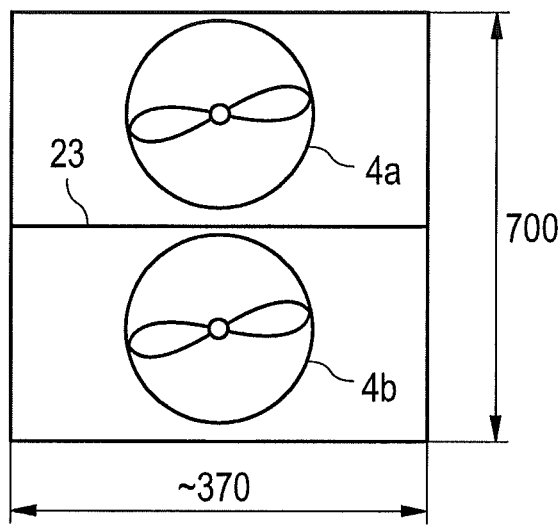
FIG. 5 is a top view of two ventilator units located above a reduced pressure shaft.

FIG. 5 shows a top view of the two ventilator units 4a and 4b in the area of the reduced pressure shaft 11. It can be seen therein that between the first ventilator unit 4a and the second ventilator unit 4b, there is a separation wall 23. The separation wall 23 is a continuation of the separation wall 10 and penetrates, in particular, the reduced pressure shaft 11. For reasons of a simple assembly of the rack housing 1, the separation walls 10 and 23 are constructed as separate parts, located in the exhaust air unit 3 or the housing cabinet 2.

Figure 6:
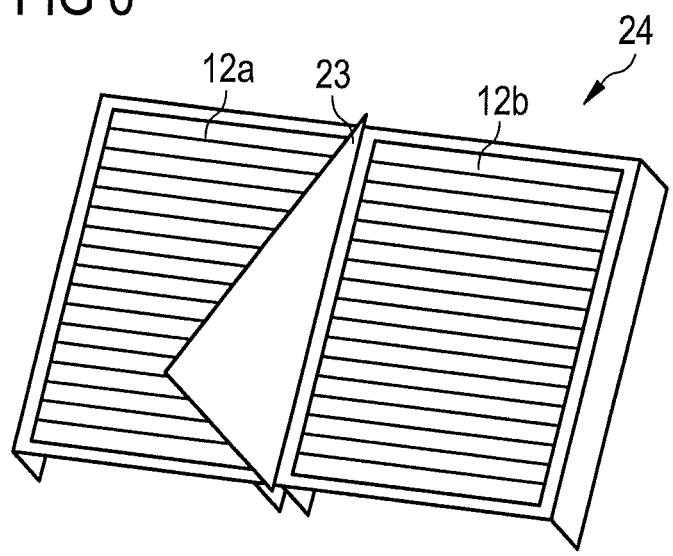
FIG. 6 is a perspective view of an arrangement including a separation wall and two non-return arrangements.

The separation wall 23 can also be seen in the perspective view of FIG. 6 of an insert 24 for the reduced pressure shaft 11. The insert 24 shown in FIG. 6 comprises, in addition to a left return arrangement 12a and a right return arrangement 12b, a separation wall 23, located between the two non-return arrangements 12a and 12b.

FIG. 7 shows another example of a rack housing 1.

In contrast to the rack housings in accordance with FIGS. 1-6, the rack housing 1 in accordance with FIG. 7 has three areas in a housing cabinet 2. The rack housing 1 comprises in accordance with FIG. 7 two first areas 5a and 5b. For example, insertion components 15 can be inserted in the housing cabinet 2, into such a rack housing 1, from the front and back or from the left and right. Between the two stacks of insertion components 15, there is a reduced pressure shaft 11 in a second area 6, by which the air heated by the insertion components 15 is removed centrally.

In contrast to the preceding example, the non-return arrangements 12 are arranged horizontally in the reduced pressure shaft 11. Moreover, radial ventilators are used as ventilator units 4 instead of axial or screw ventilators in the example according to FIG. 7. The ventilator units 4 lying behind one another pump away heated air from the reduced pressure shaft 11 and convey it in a horizontal direction to the outside. To the left and to the right, a corresponding free space is provided next to the ventilator unit 4, from which the air can finally escape upwardly through ventilation openings 25 of the exhaust air unit 3. Such a large-space exhaust air unit 3 is particularly suitable to hold additional components, for example, of a heat exchanger.

The ventilator unit 4 of the exhaust air unit 3 can be taken out to the right from the exhaust air unit 3. Conversely, a control device 16 can be taken out to the left from the housing cabinet 2 or the exhaust air unit 3.

The individual features described with regard to the different examples can be combined with one another in almost any way. For example, the axial ventilation arrangement as it was described, in particular, with regard to FIGS. 2 and 3, can be combined with a double-row rack housing as it is shown, in particular, in FIG. 7, and vice-versa, Of course, instead of the two ventilator units 4 and the corresponding housing openings 8 and non-return arrangements 12, three or more ventilator units 4 or openings 8 and non-return arrangements can also be provided to further increase the cooling performance or produce additional redundancies.

The invention claimed is:

1. A rack housing designed to hold a plurality of insertion components comprising:
   a plurality of insertion positions designed to hold the plurality of insertion components in a first area of the rack housing adjacent to a first housing side;
   a reduced pressure shaft in a second area of the rack housing adjacent to the first area and a partition wall located between the first area and the second area, wherein, in the partition wall between the reduced pressure shaft and the insertion components, first openings are provided to thereby remove air heated by the insertion components into the reduced pressure shaft;
   at least two second openings in the rack housing designed to suction off heated air from the reduced pressure shaft such that a reduced pressure can prevail in the reduced pressure shaft; and
   at least two non-return arrangements located in the reduced pressure shaft and correlated to the two second openings such that each of the non-return arrangements preventing entry of air through the correlated second opening if no air is suctioned off through this second opening, wherein
   an exhaust air unit located on the rack housing with at least two ventilator units correlated with the second openings for the suctioning off of the heated air,
   at least one first pressure sensor is included in the area of the reduced pressure shaft; and
   a control device is connected with the at least one first pressure sensor and the at least two ventilator units to control the ventilator units as a function of pressure in the reduced pressure shaft measured by the first pressure sensor, and
   the control device compares pressure measured by the first pressure sensor with a desired value and deactivates at least one of the at least two ventilator units when only one ventilator unit is required to maintain the desired value.

2. The rack housing according to claim 1, further comprising at least one separation wall located between the at least two non-return arrangements and partially in the reduced pressure shaft to increase a flow resistance between the at least two second openings, the at least one separation wall separating the second openings from one another for ventilation purposes so that there will not be a short-circuit flow between the at least two second openings during a breakdown of a suction device for the heated air.

3. The rack housing according to claim 2, wherein the at least two non-return arrangements are located at an incline relative to the second openings in the reduced pressure shaft.

4. The rack housing according to claim 1, wherein the nonreturn arrangements are return flaps or return lamellae.

5. The rack housing according to claim 1, wherein density, size, and/or number of first openings in the partition wall depend on a distance of the insertion position to the second openings and/or the non-return arrangements.

6. The rack housing according to claim 1, wherein the exhaust air unit comprises a heat exchanger that transfers thermal energy of the heated air to a cooling medium.

7. The rack housing according to claim 1, wherein the ventilator units are axial ventilators or screw ventilators and the exhaust air unit is upwardly open in an area of the ventilator units.

8. The rack housing according to claim 1, wherein the at least two ventilator units are located in at least two separate holding devices which can be removed individually from the exhaust air unit.

9. The rack housing according to claim 1, wherein the ventilator units are hot-plug components which can be taken out while in operation, wherein upon removal of one of the ventilator units, correlated second openings are automatically closed by a correlated return arrangement so that a suctioning off of the heated air takes place via another ventilator unit.

10. The rack housing according to claim 1, further comprising at least two actuators correlated with the at least two non-return arrangements and connected with the control device to open and close the non-return arrangements with the control device.

11. The rack housing according to claim 1, wherein the nonreturn arrangements close automatically if a lower air pressure prevails in the reduced pressure shaft than in an area of the corresponding second opening and open automatically if a higher pressure prevails in the reduced pressure shaft than in the area of the corresponding second opening.

12. The rack housing according to claim 1, wherein the rack housing and/or the exhaust air unit connect to an exhaust air system of a building.

13. The rack housing according to claim 1, wherein density, size, and/or number of first openings in the partition wall increases depending on a distance of the insertion position to the second openings and/or the non-return arrangements.

14. A system comprising:
a rack housing designed to hold a plurality of insertion components and
an exhaust air unit having at least two ventilator units to suction off heated air, wherein the exhaust air unit is located on the rack housing, the rack housing comprising:
a plurality of insertion positions designed to hold the plurality of insertion components in a first area of the rack housing adjacent to a first housing side;
a reduced pressure shaft in a second area of the rack housing adjacent to the first area and a partition wall located between the first area and the second area, wherein, in the partition wall between the reduced pressure shaft and the insertion components, first openings are provided to thereby remove air heated by the insertion components into the reduced pressure shaft;
at least two second openings in the rack housing designed to suction off heated air from the reduced pressure shaft, wherein the at least two openings are correlated with the at least two ventilator units of the exhaust air unit such that a reduced pressure can prevail in the reduced pressure shaft; and
at least two non-return arrangements located in the reduced pressure shaft and correlated to the at least two openings each of the non-return arrangements preventing entry of air through the correlated second opening if no air is suctioned off through the second opening, wherein
at least one first pressure sensor is included in the area of the reduced pressure shaft; and
a control device is connected with the at least one first pressure sensor and the at least two ventilator units to control the ventilator units as a function of pressure in the reduced pressure shaft measured by the first pressure sensor, and
the control device compares pressure measured by the first pressure sensor with a desired value and deactivates at least one of the at least two ventilator units when only one ventilator unit is required to maintain the desired value.

15. The system according to claim 14, further comprising at least one separation wall located between the at least two non-return arrangements and partially in the reduced pressure shaft to increase a flow resistance between the at least two second openings, the at least one separation wall separating the second openings from one another for ventilation purposes so that there will not be a short-circuit flow between the at least two second openings during a breakdown of a suction device for the heated air.

* * * * *